(12) United States Patent
Kim et al.

(10) Patent No.: US 12,108,535 B2
(45) Date of Patent: Oct. 1, 2024

(54) PRINTED CIRCUIT BOARD AND PRINTED CIRCUIT BOARD PACKAGE

(71) Applicant: SAMSUNG ELECTRO-MECHANICS CO., LTD., Suwon-si (KR)

(72) Inventors: Kwang Yun Kim, Suwon-si (KR); Seung Eun Lee, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 294 days.

(21) Appl. No.: 17/715,266

(22) Filed: Apr. 7, 2022

(65) Prior Publication Data
US 2023/0171895 A1 Jun. 1, 2023

(30) Foreign Application Priority Data
Dec. 1, 2021 (KR) .......................... 10-2021-0170148

(51) Int. Cl.
*H01S 5/18* (2021.01)
*H05K 1/02* (2006.01)
(Continued)

(52) U.S. Cl.
CPC ........... *H05K 1/186* (2013.01); *H05K 1/0298* (2013.01); *H01S 5/183* (2013.01);
(Continued)

(58) Field of Classification Search
CPC ................. H05K 1/186; H05K 1/0298; H05K 2201/096; H05K 2201/10053; H05K 2201/10151; H05K 2201/2081; H05K 1/181; H05K 2201/10121; H05K 3/4697; H05K 1/0256; H05K 1/02; H05K 1/0296; H05K 1/115; H05K 1/185; H05K 3/107;
(Continued)

(56) References Cited

U.S. PATENT DOCUMENTS

2010/0209041 A1* 8/2010 Matsushima ........ H05K 1/0274
385/88
2013/0101251 A1* 4/2013 Kawamura .............. G02B 6/12
174/266

(Continued)

*Primary Examiner* — Steven T Sawyer
(74) *Attorney, Agent, or Firm* — MORGAN, LEWIS & BOCKIUS LLP (57) ABSTRACT

A printed circuit board (PCB) includes a substrate including a first insulating layer and first wiring patterns disposed on the first insulating layer, an optical sensing chip including a vertical cavity surface emitting laser (VCSEL) and a photodiode, disposed on the first insulating layer to be in contact with at least one of the first wiring patterns, a transimpedance amplifier (TIA) chip disposed to be spaced apart from the optical sensing chip on the first insulating layer and disposed to be in contact with at least one first wiring pattern, different from the first wiring pattern connected to the optical sensing chip, among the first wiring patterns, and a dielectric layer stacked on the substrate and having a hole exposing the VCSEL and the photodiode of the optical sensing chip. The optical sensing chip and the transimpedance amplifier chip are connected through a wiring pattern disposed on the dielectric layer.

14 Claims, 5 Drawing Sheets

(51) Int. Cl.
*H05K 1/18* (2006.01)
*H01S 5/183* (2006.01)

(52) U.S. Cl.
CPC ............... *H05K 2201/096* (2013.01); *H05K 2201/10053* (2013.01); *H05K 2201/10151* (2013.01); *H05K 2201/2081* (2013.01)

(58) Field of Classification Search
CPC .... H05K 1/0203; H05K 1/0204; H05K 1/021; H05K 3/0026; H05K 3/0044; H05K 3/4007; H05K 1/024; H05K 1/028; H05K 2201/09845; H05K 2201/09854; H05K 2201/10287; H05K 2201/10416; H05K 2203/049; H01S 5/183; H01S 5/02253; H01S 5/02325; H01S 5/02345; H01S 5/02469; H01L 23/12
See application file for complete search history.

(56) References Cited

U.S. PATENT DOCUMENTS

| | | | |
|---|---|---|---|
| 2015/0069220 A1* | 3/2015 | Yagisawa | H04B 10/60 250/214 A |
| 2015/0234137 A1* | 8/2015 | Kuo | G02B 6/4214 385/14 |
| 2016/0085038 A1 | 3/2016 | Decker et al. | |
| 2018/0180808 A1 | 6/2018 | Zhang et al. | |
| 2018/0337111 A1* | 11/2018 | Jou | G02B 6/4214 |
| 2019/0166684 A1* | 5/2019 | Bird | H01S 5/02469 |
| 2021/0243889 A1* | 8/2021 | Tuominen | H01L 33/54 |
| 2023/0046449 A1* | 2/2023 | Suzuki | G02B 6/4274 |

\* cited by examiner

PRINTED CIRCUIT BOARD AND PRINTED CIRCUIT BOARD PACKAGE

CROSS-REFERENCE TO RELATED APPLICATION

This application claims benefit of priority to Korean Patent Application No. 10-2021-0170148 filed on Dec. 1, 2021 in the Korean Intellectual Property Office, the disclosure of which is incorporated herein by reference in its entirety.

TECHNICAL FIELD

The present disclosure relates to a printed circuit board (PCB) and a PCB package.

BACKGROUND

As integrated circuit (IC) technology continues to scale to smaller critical dimensions, it is increasingly difficult for existing interconnection technologies to provide appropriate communication characteristics such as high bandwidth, low power consumption, reliability and low cost.

Nevertheless, data traffic has rapidly increased with an increase of over-the-top (OTT) services such as YouTube and Netflix. Data traffic is concentrated on a switch IC, and a bandwidth (B/W) and power of the switch IC are further increased to handle the increased data traffic on the switch IC, and to reduce loss of the increased bandwidth and power, an electrical connection tends to be switched to an optical connection.

Data transmitted through an optical fiber passes through a transceiver and moves to the switch IC through a copper trace of a PCB. Transmission of data through the copper trace of the PCB increases power loss.

In order to reduce power loss, research continues into reducing loss by moving the transceiver as close as possible to the switch IC to shorten a length of the copper trace.

SUMMARY

An aspect of the present disclosure may provide a printed circuit board (PCB) in which a transceiver is embedded and a length of a copper trace connected to the transceiver, that is, an electrical connection path, is short.

An aspect of the present disclosure may also provide a PCB package in which signal loss and power loss are reduced by reducing a length of a copper trace, that is, an electrical connection path, of a PCB transmitted to a switch IC.

According to an aspect of the present disclosure, a printed circuit board (PCB) may include: a substrate including a first insulating layer and a plurality of first wiring patterns disposed on an upper surface of the first insulating layer; an optical sensing chip including a vertical cavity surface emitting laser (VCSEL) and a photodiode, and disposed on the first insulating layer to be in contact with at least one of the plurality of first wiring patterns; a transimpedance amplifier (TIA) chip disposed to be spaced apart from the optical sensing chip on the first insulating layer and disposed to be in contact with at least one first wiring pattern, different from the first wiring pattern connected to the optical sensing chip, among the plurality of first wiring patterns; and a dielectric layer stacked on the substrate and having a hole exposing the VCSEL and the photodiode of the optical sensing chip. The optical sensing chip and the transimpedance amplifier chip are connected through a wiring pattern disposed on the dielectric layer.

According to another aspect of the present disclosure, a PCB package may include: a PCB including a substrate including a first insulating layer and a plurality of first wiring patterns disposed on an upper surface of the first insulating layer, an optical sensing chip including a vertical cavity surface emitting laser (VCSEL) and a photodiode, and disposed on the first insulating layer to be in contact with at least one of the plurality of first wiring patterns, a transimpedance amplifier (TIA) chip disposed to be spaced apart from the optical sensing chip on the first insulating layer and disposed to be in contact with at least one first wiring pattern, different from the first wiring pattern connected to the optical sensing chip, among the plurality of first wiring patterns, and a dielectric layer stacked on the substrate and having a hole exposing the VCSEL and the photodiode of the optical sensing chip; an optical connector disposed at an upper portion of the exposed hole and optically coupled with the VCSEL and the photodiode through the hole; and a switch IC chip substrate package mounted on an upper portion of the PCB. The optical sensing chip and the transimpedance amplifier chip may be connected through a wiring pattern disposed at the dielectric layer, and the transimpedance amplifier chip and the switch IC chip substrate package may be connected through another wiring pattern disposed at the dielectric layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Printed Circuit Board (PCB)

Figure 1:
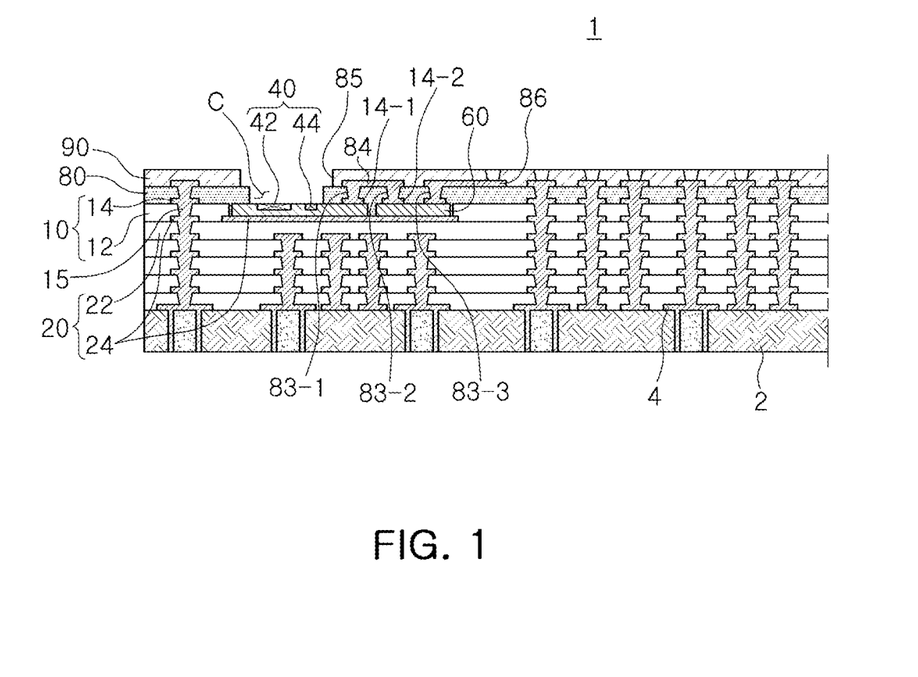
FIG. 1 is a cross-sectional view schematically illustrating a printed circuit board according to an exemplary embodiment in the present disclosure.

FIG. 1 is a cross-sectional view schematically illustrating a PCB according to an exemplary embodiment in the present disclosure.

A PCB 1 according to an exemplary embodiment in the present disclosure includes a substrate unit 10, an optical sensing chip 40, a transimpedance amplifier chip 60, and a dielectric layer 80.

The substrate unit 10 includes a first insulating layer 12 and a plurality of first wiring patterns 14 formed on an upper surface of the first insulating layer 12.

A second insulating layer 22 may be formed below the first insulating layer 12, and a plurality of second wiring patterns 24 may be formed on an upper surface of the second insulating layer 22. As such, when the PCB 1 is viewed in a cross-section, the insulating layers 12 and 22 and the wiring patterns 14 and 24 formed on the upper surface thereof may be continuously stacked and disposed, and the number of stacks of the substrate units 10 and 20 including the insulating layers 12 and 22 and the wiring patterns 14 and 24 may be appropriately selected.

The insulating layers 12 and 22 may be formed of an insulating material, the insulating material may include an organic material, and a thermosetting resin such as an epoxy resin, a thermoplastic resin such as polyimide, or a mixture of these resins with an inorganic filler or a resin impregnated in a core material of an inorganic filler, for example, Ajinomoto build-up film (ABF), etc. may be used.

The wiring patterns 14 and 24 perform various functions in the PCB 1. For example, the wiring patterns 14 and 24 may include a ground (GND) pattern, a power (PWR) pattern, and a signal (S) pattern. Here, the signal (S) pattern includes various signals excluding the ground (GND) pattern and the power (PWR) pattern, for example, a data signal. Also, the wiring pattern may have various shapes according to layers. Materials forming the wiring patterns 14 and 24 may include conductive materials, specifically, a metal material, such as copper (Cu), aluminum (Al), silver (Ag), tin (Sn), gold (Au), nickel (Ni), lead (Pb), titanium (Ti) or a conductive material such as an alloy thereof, specifically, a metal material may be used.

In addition, the first wiring pattern 14 and the second wiring pattern 24 formed on the upper surfaces of the first insulating layer 12 and the second insulating layer 22 are electrically connected to each other through a wiring via 15, and as a result, an electrical path is formed in the PCB 1. Each wiring via 15 may include a conductive material, specifically, a metal material, such as copper (Cu), aluminum (Al), silver (Ag), tin (Sn), gold (Au), nickel (Ni), lead (Pb), titanium (Ti), or an alloy thereof. The wiring via 15 performs various functions in the PCB 1 according to a design of the corresponding layer. For example, the wiring via 15 may include a ground via, a power via, a signal via, and the like. The wiring via 15 may be a field type via filled with a conductive material or a conformal type in which a conductive material is disposed along a wall surface of the via. Each of the wiring vias 15 may have an hourglass shape, a cylinder shape, or the like, and two adjacent wiring vias may have a tapered shape in mutually opposite directions.

The optical sensing chip 40 is embedded and installed in the substrate unit 10 of the PCB 1. Although it is illustrated that the optical sensing chip 40 is embedded in the insulating layer 12 of one substrate unit 10 in an exemplary embodiment, the present disclosure is not limited thereto and the optical sensing chip 40 may be embedded in a plurality of insulating layers 12. At this time, the optical sensing chip 40 is disposed on the first insulating layer 12, and at least one first wiring pattern 14-1 among the first wiring patterns 14 is in contact with and electrically connected to the optical sensing chip 40.

The optical sensing chip 40 may be a silicon photonics (Sipho) chip, and includes a vertical cavity surface emitting laser (VCSEL) 44 and a photodiode 42 as optical elements.

The optical sensing chip 40 may be optically connected to an external optical connector 120 (refer to FIG. 3) such that the VCSEL 44 emits light and the photodiode 42 receives light. The photodiode 42 converts the received light into current or voltage, and the transimpedance amplifier chip 60 amplifies the current or voltage converted by the photodiode 42 into a required dynamic range.

The transimpedance amplifier chip 60 is electrically connected to the optical sensing chip 40, is disposed to be spaced apart from the optical sensing chip 40 in the first insulating layer 12, and is in contact with at least one first wiring pattern 14-2 different from the first wiring pattern 14-1 connected to the optical sensing chip 40, among the first wiring patterns 14.

The dielectric layer 80 is stacked at an upper portion of the substrate unit 10, and the dielectric layer 80 has a hole 85 through which the VCSEL 44 and the photodiode 42 of the optical sensing chip 40 are exposed.

Figure 3:
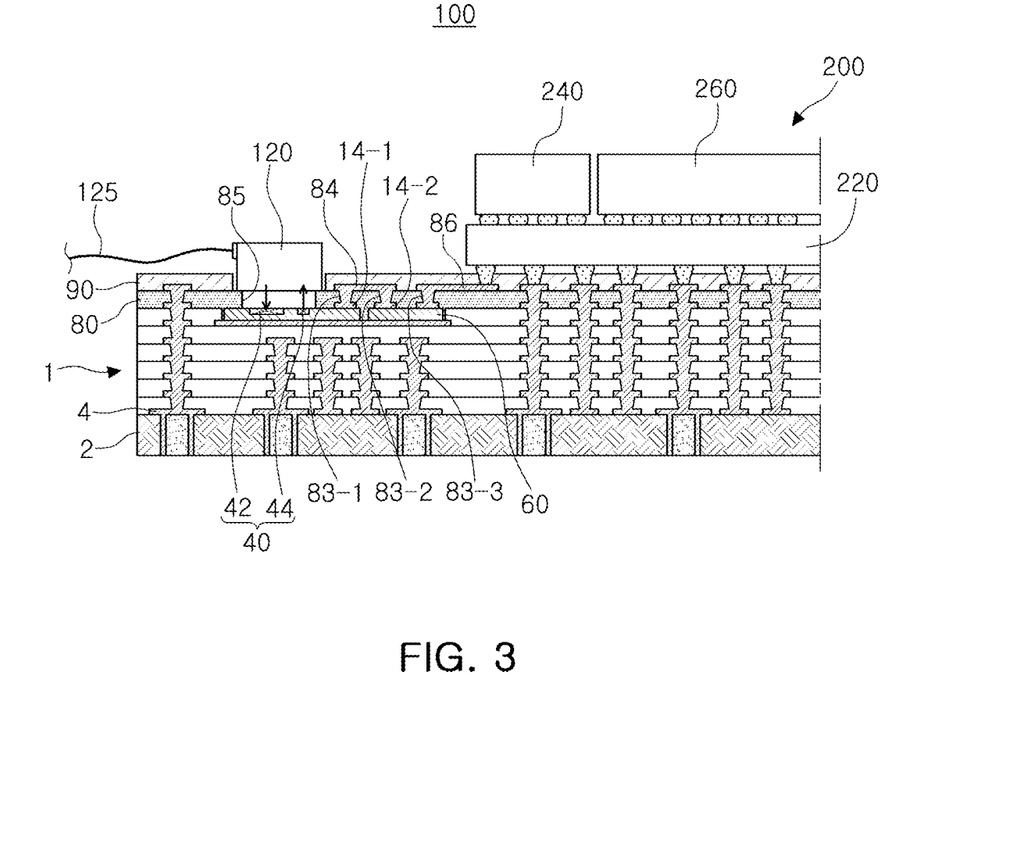
FIG. 3 is a cross-sectional view schematically illustrating a printed circuit board package according to an exemplary embodiment in the present disclosure.

The hole 85 serves as an optical signal transmission path between the optical sensing chip 40 and the optical connector 120 when the optical sensing chip 40 is optically connected to the optical connector 120 (refer to FIG. 3).

The dielectric layer 80 may include a dielectric material, and may be a photo-imageable sensitive (PID) material that is a photosensitive insulating material. With PID materials, a hole may be formed relatively easily through a photoresist process that includes masking, exposure, and development processes.

The optical sensing chip 40 and the transimpedance amplifier chip 60 are electrically connected through a wiring pattern 84 formed in the dielectric layer 80.

A cavity C may be formed in the first insulating layer 12, the optical sensing chip 40 may be disposed in the cavity C, and the dielectric layer 80 may fill a space between the optical sensing chip 40 and a wall of the cavity C, and may fill a space between the optical sensing chip 40 and the transimpedance amplifier chip 60 and a space between the transimpedance amplifier chip 60 and a wall of the cavity C.

If the wiring pattern 84 formed on the dielectric layer 80 is referred to as a third wiring pattern, the third wiring pattern 84 is connected to a first via 83-1 and a second via 83-2 formed in the dielectric layer 80.

Also, the third wiring pattern 84 is connected to the first wiring pattern 14-1 in contact with the optical sensing chip 40 through the first via 83-1, and is connected to the first wiring pattern 14-2 in contact with the transimpedance amplifier chip 60 through the second via 83-2. By forming an electrical path to be very short in this manner, loss of a transmission signal received from the optical sensing chip 40 may be reduced.

The PCB 1 may include a solder resist layer 90 stacked on the dielectric layer 80 to protect the third wiring pattern 84.

Meanwhile, a second wiring pattern 24 is formed on an upper surface of the second insulating layer 22 below the first insulating layer 12. The second wiring pattern 24 may connect the optical sensing chip 40 and the transimpedance amplifier chip 60 to each other.

FIGS. 2A to 2G are process diagrams illustrating an example of a manufacturing process of a PCB according to an exemplary embodiment in the present disclosure. This is an exemplary embodiment for describing a manufacturing method for manufacturing a PCB package, and each process may be performed in a different order unless a specific order is clearly stated in context.

Figure 2A:
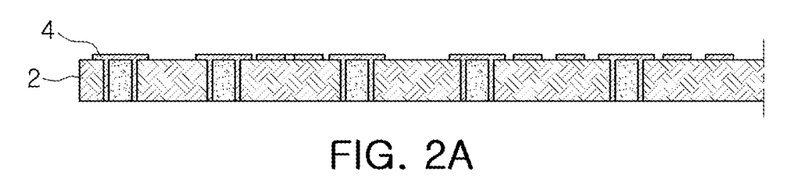
FIGS. 2A to 2G are process diagrams illustrating an example of a manufacturing process of a printed circuit board according to an exemplary embodiment in the present disclosure.
Figure 2B:
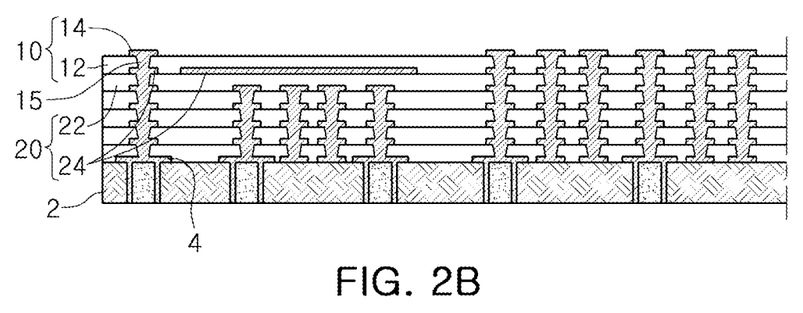
Figure 2C:
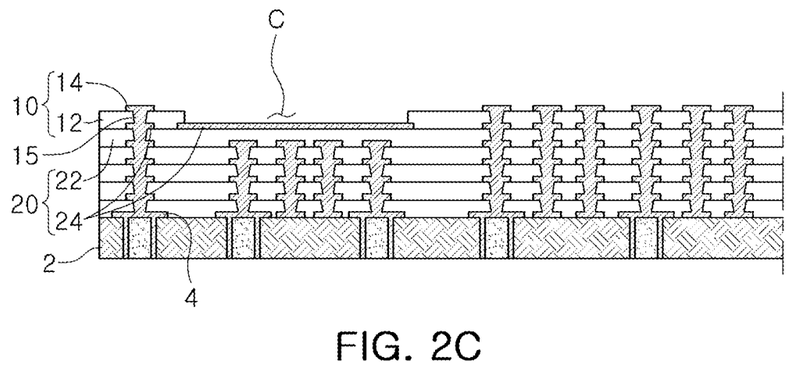

FIG. 2A illustrates a process of forming a patterned layer 4 on a substrate core insulating layer 2. FIG. 2B illustrates a process of building up a plurality of substrate units 10, 20 including patterned layers 14 and 24 formed on insulating layers 12 and 22 above core insulating layer 2. FIG. 2C illustrates a process of forming a cavity C for embedding and mounting the optical sensing chip 40 and the transimpedance amplifier chip 60 in the uppermost insulating layer 12.

Figure 2D:
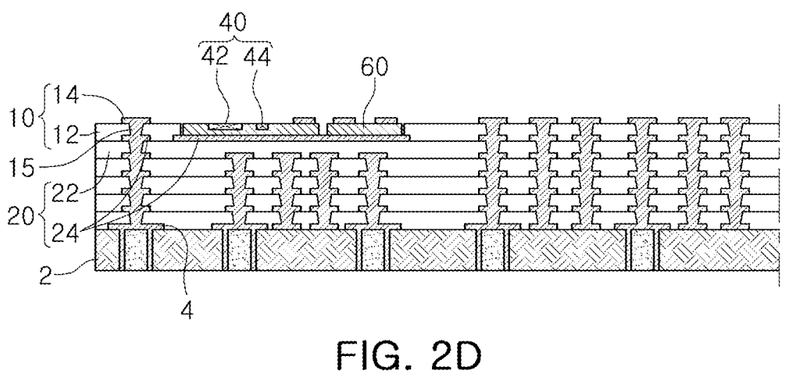
Figure 2E:
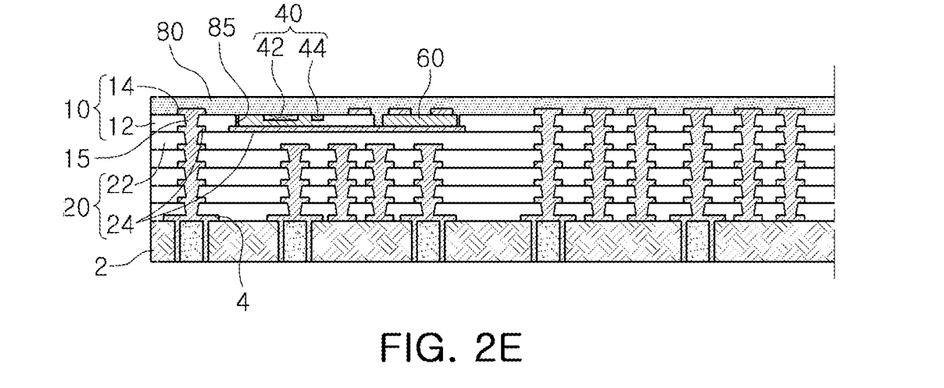

FIG. 2D illustrates the process of mounting the optical sensing chip 40 and the transimpedance amplifier chip 60 in the cavity C, and FIG. 2E illustrates a process of stacking a dielectric layer 80 for protecting the uppermost insulating layer 12 and the wiring pattern 14 thereon. Here, the dielectric layer 80 uses a PID material advantageous for hole formation. The dielectric layer 80 may fill a space between the optical sensing chip 40 and a wall of the cavity C, a space between the optical sensing chip 40 and the transimpedance amplifier chip 60, and a space between the transimpedance amplifier chip 60 and a wall of the cavity C, so that the optical sensing chip 40 and the transimpedance amplifier chip 60 are secured in the cavity C.

Figure 2F:
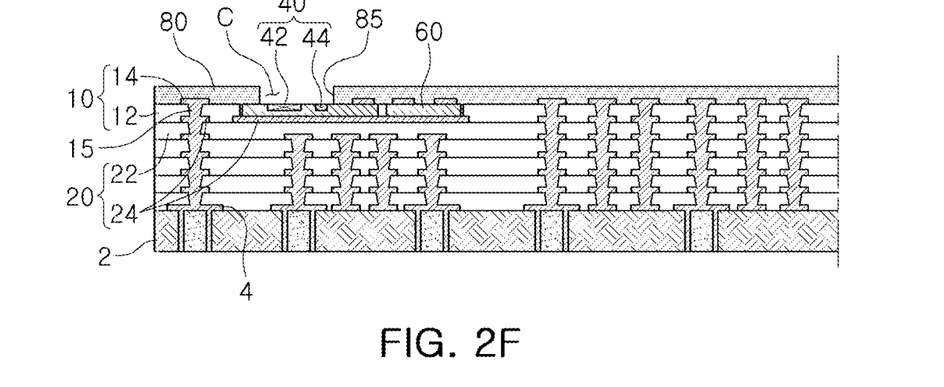
Figure 2G:
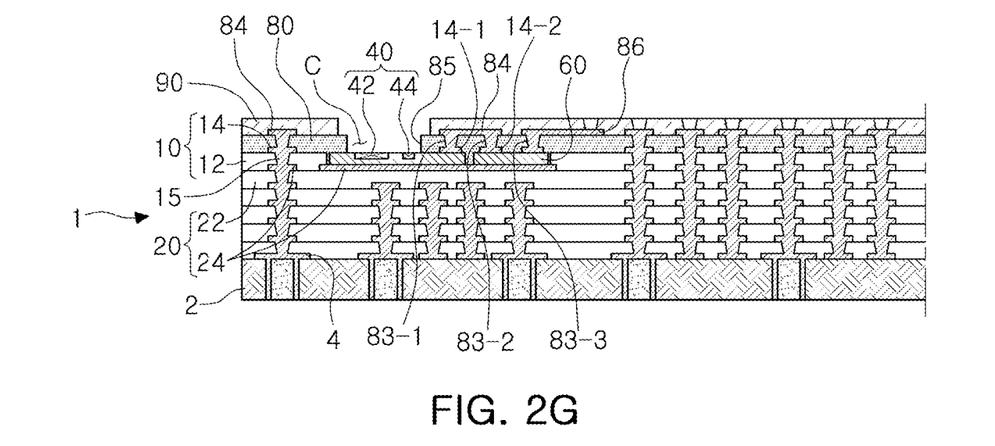

FIG. 2F illustrates that a hole 85 is formed in the dielectric layer 80 to expose the VCSEL 44 and the photodiode 42 of the optical sensing chip 40, and FIG. 2G illustrates a process of applying a solder resist 90 and patterning the solder resist 90 to form a hole on the hole 85 and holes respectively exposing portions of third wiring pattern 84 for external connections to complete the PCB 1. The solder resist 90 also exposes the VCSEL 44 and the photodiode 42 and forms a wiring pattern to be connected to an external substrate package.

FIG. 3 is a cross-sectional view schematically illustrating a PCB package according to an exemplary embodiment in the present disclosure.

Referring to FIG. 3, the PCB package 100 according to an exemplary embodiment in the present disclosure includes a PCB 1, an optical connector 120, and a switch IC chip substrate package 200.

A structure of the PCB 1 is substantially the same as that of the PCB 1 of FIG. 1 described above. Hereinafter, a repeated description of the PCB 1 will be omitted and different points of the PCB 1 will be described and the PCB package 100 in which a switch IC chip 260 is mounted on the PCB 1 will be described.

First, a fourth wiring pattern 86 spaced apart from the third wiring pattern 84 is formed on the dielectric layer 80 of the PCB 1, and the fourth wiring pattern 86 is connected to the third via 83-3 formed in the dielectric layer 80. Here, one end of the fourth wiring pattern 86 is connected to the transimpedance amplifier chip 60 through the third via 83-3, and the other end of the fourth wiring pattern 86 is connected to the switch IC chip substrate package 200.

The switch IC chip 260 may be mounted in the form of a switch IC chip substrate package 200 on the PCB 1.

In addition, in order to easily mount the switch IC chip 260, an interposer substrate 220 may be used in the middle, and the memory chip 240 may be mounted together with the switch IC chip 260 on the interposer substrate 220 to maximize space utilization of the package structure and reduce a size of the package.

An external pad of the silicon interposer substrate 220 and the other end of the fourth wiring pattern 86 may be connected, and a length of an electrical wiring in which an optical signal is converted and connected to the switch IC chip 260 may be reduced.

Referring to a data signal movement with the switch IC chip 260 of the PCB package 100 described above, data transmitted through an optical fiber 125 passes through the optical connector 120 and is transmitted to the optical sensing chip embedded in the PCB 1. Here, the VCSEL 44 and the photodiode 42 of the optical sensing chip 40 are optically connected to the optical connector 120 through the hole 85 formed in the dielectric layer 80 formed of the PID material. The data signal received by the photodiode 42 are transmitted to the transimpedance amplifier chip 60 through the third wiring pattern 84 on the dielectric layer 80 and the first via 83-1 and the second via 83-2 penetrating through the dielectric layer 80 and is amplified. The amplified data signal is transmitted to the switch IC chip substrate 260 disposed adjacent to the transimpedance amplifier chip 60. The switch IC chip substrate 260 may be disposed on the switch IC chip substrate package 200 mounted above the PCB 1. This structure is suitable for reducing signal loss and power loss by reducing a length of a copper trace of the PCB 1 transmitted to the switch IC chip 260, that is, an electrical connection path.

Figure 4A:
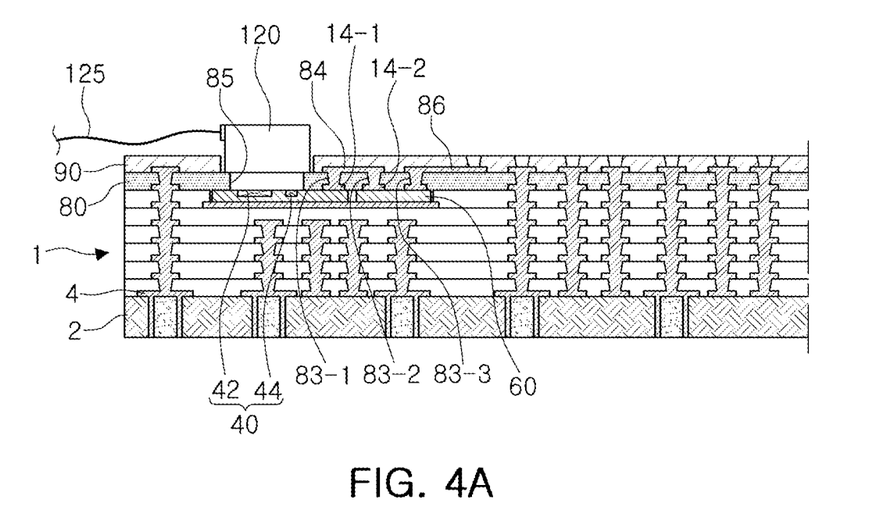
FIGS. 4A and 4B are process diagrams illustrating an example of a manufacturing process of a printed circuit board package according to an exemplary embodiment in the present disclosure.
Figure 4B:
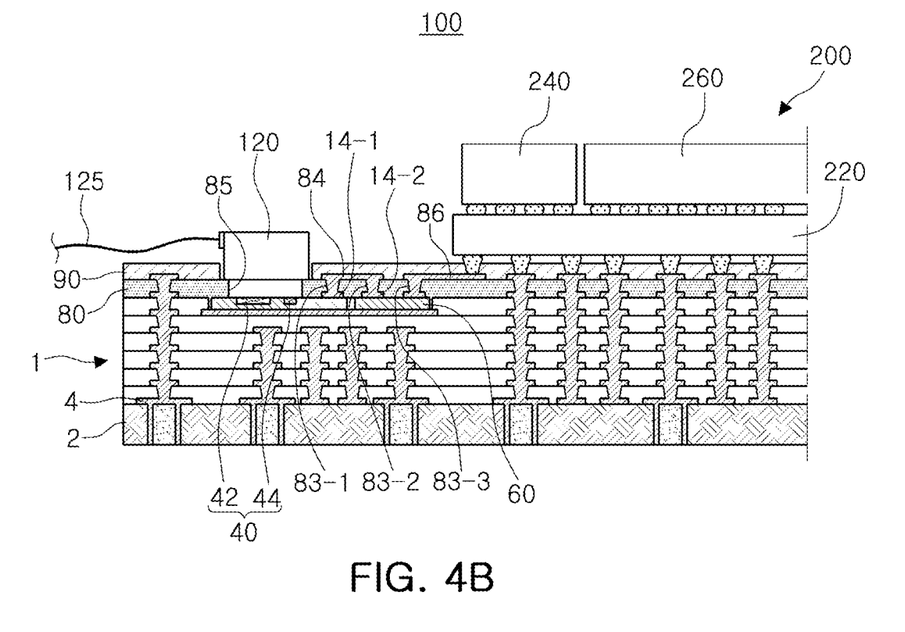

FIGS. 4A and 4B are process diagrams illustrating an example of a manufacturing process of a PCB package according to an exemplary embodiment in the present disclosure. This is an exemplary embodiment for explaining a manufacturing method for manufacturing a PCB package, and the process of FIG. 4A and the process of FIG. 4B may be performed in reverse order.

FIG. 4A illustrates a process in which the optical connector 120 is mounted with the VCSEL 44 and the photodiode 42 exposed in the PCB 1 of FIG. 2G with a space therebetween.

FIG. 4B illustrates a process in which the switch IC chip substrate package 200 including the switch IC chip 260 is mounted on a wiring pad of the PCB 1 and electrically connected.

As set forth above, according to exemplary embodiments in the present disclosure, since the transceiver is embedded and the length of the copper trace connected thereto, that is, the electrical connection path, is formed to be short, a signal loss in the electrical connection path may be reduced.

In addition, packaging with the switch IC chip is possible without the need for a separate interposer substrate for the transceiver, thereby simplifying a manufacturing process and reducing manufacturing cost.

According to the PCB package of the present disclosure, signal loss and power loss may be reduced by reducing the length of the copper trace of the PCB transmitted to the switch IC chip, that is, the electrical connection path.

In addition, since the transimpedance amplifier chip as well as the transceiver are embedded in the PCB and the switch IC chip structure is installed to be adjacent to the transimpedance amplifier chip, a size of the package PCB may be reduced. When the size of the package PCB is reduced, the manufacturing cost thereof is also reduced.

While exemplary embodiments have been shown and described above, it will be apparent to those skilled in the art that modifications and variations could be made without departing from the scope of the present disclosure as defined by the appended claims.

What is claimed is:

1. A printed circuit board (PCB) comprising: a substrate including a first insulating layer and a plurality of first wiring patterns disposed on an upper surface of the first insulating layer, and a cavity is provided in the first insulating layer; an optical sensing chip including a vertical cavity surface emitting laser (VCSEL) and a photodiode, disposed in the cavity, and connected to at least one of the plurality of first wiring patterns; a transimpedance amplifier (TIA) chip disposed to be spaced apart from the optical sensing chip in the cavity, and connected to at least one first wiring pattern, different from the first wiring pattern connected to the optical sensing chip, among the plurality of first wiring patterns; and a dielectric layer stacked on the substrate and having a hole exposing the VCSEL and the photodiode of the optical sensing chip, wherein the optical sensing chip and the transimpedance amplifier chip are connected through a wiring pattern disposed on the dielectric layer, and wherein the dielectric layer is disposed in a space between each of the optical sensing chip and the transimpedance amplifier chip, and a wall of the cavity.

2. The PCB of claim 1, wherein the dielectric layer includes a photo-imageable dielectric (PID) material.

3. The PCB of claim 1, further comprising:
a second insulating layer disposed below the first insulating layer; and
a second wiring pattern disposed on an upper surface of the second insulating layer,
wherein the second wiring pattern connects the optical sensing chip and the transimpedance amplifier chip to each other.

4. The PCB of claim 1, wherein
the wiring pattern disposed on the dielectric layer includes a third wiring pattern disposed at an upper portion of the dielectric layer,
the third wiring pattern is connected to a first via and a second via disposed in the dielectric layer, and
the third wiring pattern is connected to the first wiring pattern in contact with the optical sensing chip through the first via, and connected to the first wiring pattern in contact with the transimpedance amplifier chip through the second via.

5. The PCB of claim 4, further comprising a solder resist layer covering the third wiring pattern and stacked at an upper portion of the dielectric layer.

6. A printed circuit board (PCB) package comprising: a PCB including a substrate including a first insulating layer and a plurality of first wiring patterns disposed on an upper surface of the first insulating layer, and a cavity is provided in the first insulating layer; an optical sensing chip including a vertical cavity surface emitting laser (VCSEL) and a photodiode, disposed in the cavity, and connected to at least one of the plurality of first wiring patterns, a transimpedance amplifier (TIA) chip disposed to be spaced apart from the optical sensing chip in the cavity, and connected to at least one first wiring pattern, different from the first wiring pattern connected to the optical sensing chip, among the plurality of first wiring patterns, and a dielectric layer stacked on the substrate and having a hole exposing the VCSEL and the photodiode of the optical sensing chip; an optical connector disposed at an upper portion of the exposed hole and optically coupled with the VCSEL and the photodiode through the hole; and a switch IC chip substrate package mounted on an upper portion of the PCB.

7. The PCB package of claim 6, wherein the optical sensing chip and the transimpedance amplifier chip are connected through a wiring pattern disposed at the dielectric layer, and the transimpedance amplifier chip and the switch IC chip substrate package are connected through another wiring pattern disposed at the dielectric layer.

8. The PCB package of claim 6, wherein the dielectric layer includes a photo-imageable dielectric (PID) material.

9. The PCB package of claim 6, further comprising:
a second insulating layer below the first insulating layer and
a second wiring pattern disposed on an upper surface of the second insulating layer,
wherein the second wiring pattern connects the optical sensing chip and the transimpedance amplifier chip to each other.

10. The PCB package of claim 7, wherein
the wiring pattern disposed at the dielectric layer to connect the optical sensing chip and the transimpedance amplifier chip to each other includes a third wiring pattern disposed at an upper portion of the dielectric layer,
the third wiring pattern is connected to a first via and a second via disposed in the dielectric layer, and
the third wiring pattern is connected to the first wiring pattern in contact with the optical sensing chip through the first via, and connected to the first wiring pattern in contact with the transimpedance amplifier chip through the second via.

11. The PCB package of claim 10, wherein
the another wiring pattern disposed at the dielectric layer to connect the transimpedance amplifier chip and the switch IC chip substrate package to each other includes a fourth wiring pattern spaced apart from the third wiring pattern disposed at the upper portion of the dielectric layer,
the fourth wiring pattern is connected to a third via disposed in the dielectric layer, and
one end of the fourth wiring pattern is connected to the transimpedance amplifier chip through the third via and the other end of the fourth wiring pattern is connected to the switch IC chip substrate package.

12. The PCB package of claim 11, wherein,
in the switch IC chip substrate package, a memory chip and a switch IC chip are mounted on a silicon interposer substrate, and
the silicon interposer substrate is connected to the other end of the fourth wiring pattern.

13. The PCB package of claim 11, further comprising a solder resist layer covering the third wiring pattern and the fourth wiring pattern and stacked at an upper portion of the dielectric layer.

14. The PCB package of claim 6, wherein the dielectric layer is disposed in a space between each of the optical sensing chip and the transimpedance amplifier chip and a wall of the cavity.

* * * * *